United States Patent
Nelson et al.

(10) Patent No.: US 6,395,982 B2
(45) Date of Patent: May 28, 2002

(54) LEADED SEMICONDUCTOR DEVICE PACKAGE FOR USE IN NONSOLDERING ASSEMBLING

(76) Inventors: William John Nelson, 233, Pao Chiao Road, Hsin Tien; Alice Tseng, 4F, No. 12, Alley 6, Lane 232, Sec. 3, MuHsin Rd.; K. R. Lee, 7F-1, No. 8, Lane 30, ChinNein Rd.; Stanley Lai, 2F, No. 31, JingHsin Rd., all of Taipei (TW)

( * ) Notice: Subject to any disclaimer, the term of this patent is extended or adjusted under 35 U.S.C. 154(b) by 32 days.

(21) Appl. No.: 09/209,345

(22) Filed: Dec. 11, 1998

(30) Foreign Application Priority Data

Sep. 28, 1998 (TW) .......................................... 87216026

(51) Int. Cl.⁷ .............................................. H01L 23/02
(52) U.S. Cl. ...................... 174/52.4; 439/70; 257/694; 257/696
(58) Field of Search ................................ 257/694, 696; 174/52.1, 52.2, 52.4; 361/772, 773; 439/70; 338/273

(56) References Cited

U.S. PATENT DOCUMENTS

| | | | | |
|---|---|---|---|---|
| 3,588,618 A | * | 6/1971 | Otte | ........................... 361/809 |
| 4,822,988 A | | 4/1989 | Gloton | ........................ 235/492 |
| 5,107,324 A | * | 4/1992 | Iwahara et al. | ............. 257/696 |
| 5,446,623 A | * | 8/1995 | Kanetake | ..................... 361/760 |
| 6,181,009 B1 | * | 1/2001 | Takahashi et al. | .......... 257/735 |

FOREIGN PATENT DOCUMENTS

EP 0225238 4/1986

OTHER PUBLICATIONS

"Three dimensional module power and signal distribution mechanism" IBM Technical Disclosure Bulletin., vol. 27, No. 10A, Mar. 1985, pp. 5564–5565, XP002105011.
Patent Abstract of Japan, JP 60 081851 May 9, 1985.

* cited by examiner

Primary Examiner—Dean A. Reichard
Assistant Examiner—Hung V Ngo

(57) ABSTRACT

A leaded semiconductor device package for nonsoldering assembling is disclosed. In the package of the invention, both leads of a semiconductor device package are flattened, cut and bent by automatic machines on the bais of conventional packaging process. Unlike a conventional semiconductor device package which is electrically connected to a circuit by soldering, the flattened and bent parts of both leads of the semiconductor device package can be electrically connected to a circuit by elastically contacting and directly assembling without soldering.

4 Claims, 3 Drawing Sheets

LEADED SEMICONDUCTOR DEVICE PACKAGE FOR USE IN NONSOLDERING ASSEMBLING

BACKGROUND OF THE INVENTION

1. Field of the Invention

The invention relates to a leaded semiconductor device package, and in particular to a package in which semiconductor device leads are processed to be adapted to nonsoldering assembling.

2. Description of the Related Art

Both leads of a conventional semiconductor device package with, for example, a specification of DO-41, are electrically connected to a circuit by soldering. However, under a circumstance where soldering equipment cannot be provided or used, a semiconductor device package having leads which can be electrically connected to a circuit without soldering would be required. If a leaded semiconductor device package made for nonsoldering assembling is provided, it would be an innovative addition to conventional semiconductor device packages which are made by soldering leads.

SUMMARY OF THE INVENTION

In view of the above, the first object of the invention is to provide a semiconductor device lead package made for nonsoldering assembling. In the package, both leads of conventional semiconductor device package are partially flattened, cut and bent so as to be connected to a circuit without soldering.

The second object of the invention is to provide a leaded semiconductor device package made for nonsoldering, assembling by originally existing equipment. Therefore, original resources can be utilized effectively and investments in new equipment can be greatly reduced.

BRIEF DESCRIPTION OF THE DRAWINGS

The invention will be more fully understood from the detailed description given hereinbelow and the accompanying drawings which are given by way of illustration only, and thus do not limit the present invention, and wherein.

DETAILED DESCRIPTION OF THE PREFERRED EMBODIMENTS

Figure 1:
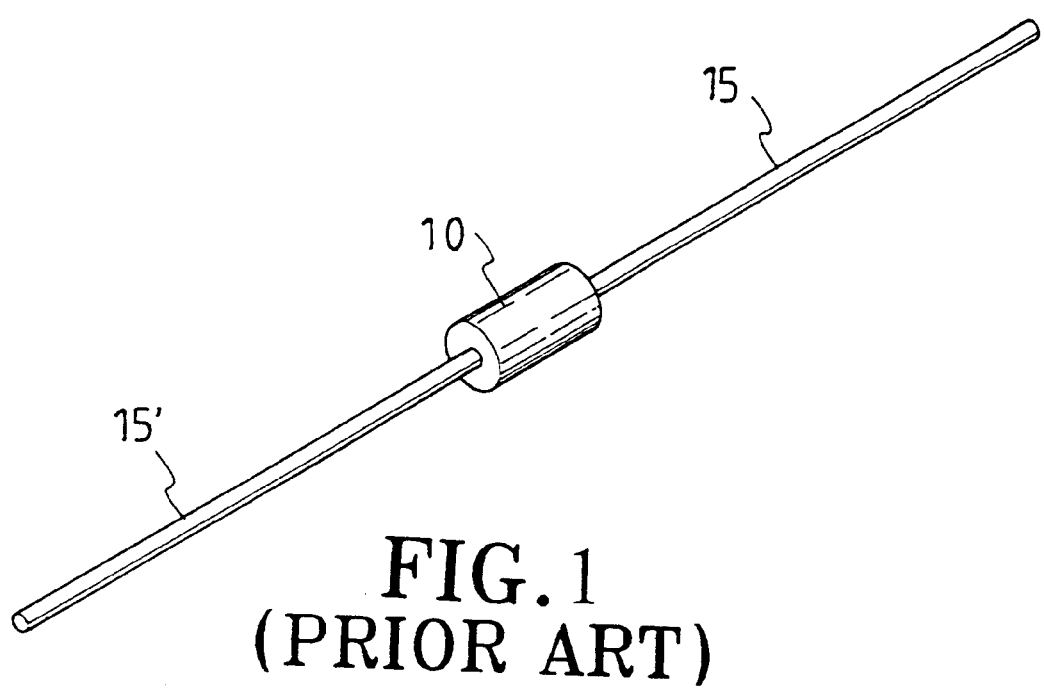
FIG. 1 is a schematic view showing a conventional semiconductor device package.

FIG. 1 shows a conventional semiconductor device package 10 with a specification of DO-41. The conventional semiconductor device package 10 has a length in the range of 4.06 mm–5.21 mm and a diameter in the range of 2.03–2.72 mm. Two leads 15 on both sides of the semiconductor device package 10 each has a length of approximately 27.94 mm and a diameter in the range of 0.71–0.86 mm.

Figure 2:
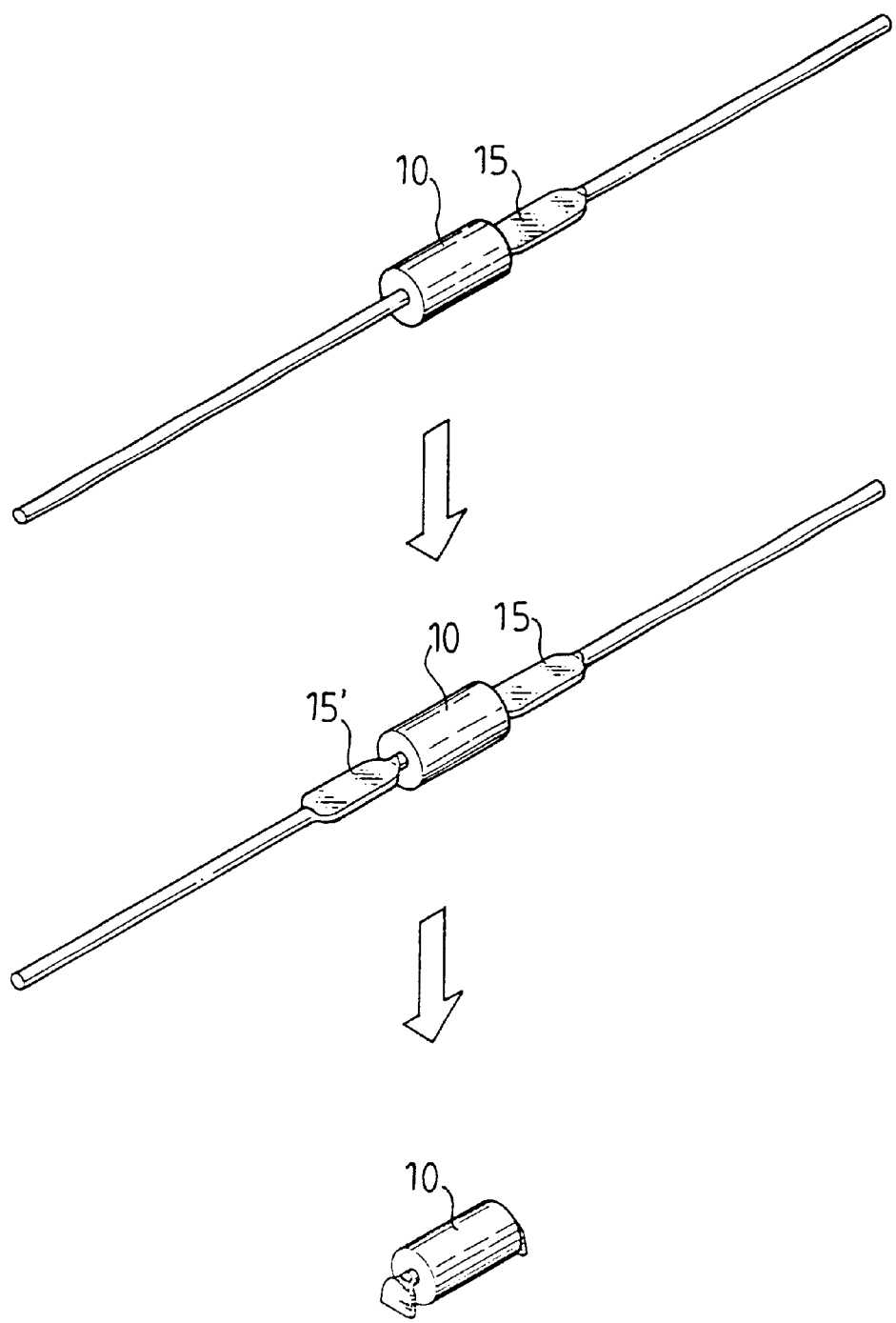
FIG. 2 is a schematic view showing the steps of flattening, cutting and bending semiconductor device package leads of the present invention.
Figure 3:
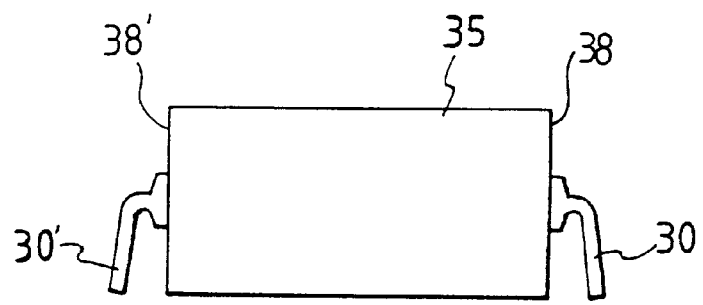
FIG. 3 is a side view showing a semiconductor device package having non-soldered leads according to the invention.

FIG. 2 is a schematic view showing the steps of processing conventional semiconductor device package leads by an automatic machine. In the steps, part of one lead 15 adjacent to the semiconductor device package 10 is first flattened, and then part of the other lead 15' adjacent to the semiconductor device package 10 is flattened. The remaining parts of the two leads 15 and 15' which are not flattened, are cut off. Next, the flattened parts of the two leads 15 and 15' are bent. The above-stated two-stage flattening step (one stage is to flatten one lead and the other stage is to flatten the other lead) can prevent internal component of the semiconductor device package 10 from damage. FIG. 3 is a side view showing a semiconductor device package 35 having non-soldered leads 30 and 30' according to the invention. The length of leads 30 and 30' have been trimmed to be at the same level with the periphery of the side surfaces 38 and 38' of the semiconductor device package 35. Furthermore, there is a small angle formed between each bent lead 30 and a corresponding side surface of the semiconductor device package 35 for a better elastic contact with a circuit.

Figure 4:
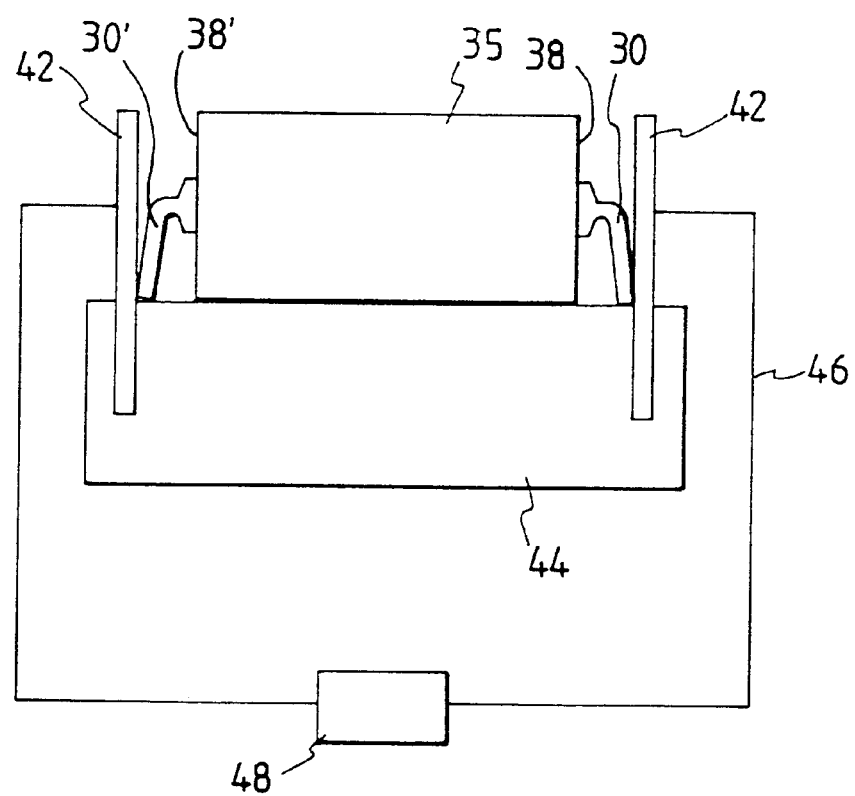
FIG. 4 is a semiconductor device package according to the invention which is assembled on a circuit.

FIG. 4 is a semiconductor device package according to the invention assembled to a circuit 48. As shown in FIG. 4, the semiconductor device package 35 is mounted on a carrier 44, wherein the two flattened and bent leads 30 and 30' are elastically engaged with two copper plates 42 respectively. The semiconductor device package 35 is electrically connected to the circuit 48 via the two copper plates 42 and a wire 46. Furthermore, as can be seen from FIG. 4, there is a small angle formed between each of the flattened and bent leads 30, 30' and corresponding side surfaces 38, 38' of the semiconductor device package 35 respectively for a better elastic contact with the copper plates 42.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded in the broadest interpretation so as to encompass all such modifications and similar arrangements.

What is claimed is:

1. A leaded semiconductor device package for use in nonsoldering assembling, wherein said package has two sides and two leads each lead extending outwards from each side of the semiconductor package, the leads of said semiconductor package are flattened, cut and bent, such that said semiconductor package can be electrically connected to an electronic circuit through elastic contact, wherein the leads bend only at a junction between the leads and the sides of the package, and still further wherein said leads extend straight from the bend at the junction to an end of the leads where the leads have been cut, and are substantially parallel with the sides of said package, and further wherein each lead ends at a same level with the periphery of the sides of the package.

2. The leaded semiconductor device package as claimed in claim 1, wherein a small angle is formed between each of the flattened, cut and bent leads and each of the sides of the semiconductor device package respectively for a better elastic contact with the electronic circuit.

3. A leaded semiconductor device package for use in nonsoldering assembling, wherein said package has two sides and two leads each lead extending outwards from each side of the semiconductor package, the leads of said semiconductor package are flattened, cut and bent such that said semiconductor package can be electrically connected to an electronic circuit through elastic contact, and further wherein the length of the two leads are cut such that each lead ends at a same level with the periphery of the sides of the package, said device package electrically connected to the circuit, wherein each of the flattened, cut and bent leads elastically engages with two copper plates, the copper plates being substantially parallel with the two sides of said package respectively, and wherein a wire connects the two copper plates to the electronic circuit.

4. The leaded semiconductor device package as claimed in claim 3 wherein the package is assembled to the electronic circuit without soldering.

* * * * *